United States Patent
van Heck et al.

(10) Patent No.: US 9,474,155 B2
(45) Date of Patent: Oct. 18, 2016

(54) SUBMOUNT, ASSEMBLY INCLUDING SUBMOUNT, METHOD OF ASSEMBLING AND ASSEMBLING DEVICE

(71) Applicants: Nederlandse Organisatie voor toegepast-natuurwetenschappelijk onderzoek TNO, Delft (NL); IMEC vzw, Leuven (BE)

(72) Inventors: Gerardus Titus van Heck, Delft (NL); Margaretha Maria de Kok, Delft (NL)

(73) Assignees: IMEC vzw, Leuven (BE); Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 211 days.

(21) Appl. No.: 14/385,071

(22) PCT Filed: Mar. 14, 2013

(86) PCT No.: PCT/NL2013/050172
§ 371 (c)(1),
(2) Date: Sep. 12, 2014

(87) PCT Pub. No.: WO2013/137732
PCT Pub. Date: Sep. 19, 2013

(65) Prior Publication Data
US 2015/0041201 A1 Feb. 12, 2015

(30) Foreign Application Priority Data
Mar. 15, 2012 (EP) .................................... 12159639

(51) Int. Cl.
*H05K 1/00* (2006.01)
*H05K 1/11* (2006.01)
(Continued)

(52) U.S. Cl.
CPC ............. *H05K 1/111* (2013.01); *H05K 1/0283* (2013.01); *H05K 1/09* (2013.01); *H05K 1/181* (2013.01);
(Continued)

(58) Field of Classification Search
CPC ................... H05K 1/0277; H05K 2201/0133; H05K 2201/09063
See application file for complete search history.

(56) References Cited

U.S. PATENT DOCUMENTS

| | | | | |
|---|---|---|---|---|
| 8,332,053 B1 * | 12/2012 | Patterson | ............ | H01L 23/5387 600/393 |
| 2002/0094701 A1 * | 7/2002 | Biegelsen | .............. | B25J 13/084 439/32 |

(Continued)

FOREIGN PATENT DOCUMENTS

| DE | 102007014477 A1 | 9/2008 |
|---|---|---|
| GB | 2416621 A | 2/2006 |

(Continued)

OTHER PUBLICATIONS

"International Application Serial No. PCT/NL2013/050172, International Preliminary Report on Patentability mailed Sep. 16, 2014", 6 pgs.

(Continued)

*Primary Examiner* — Steven T Sawyer
(74) *Attorney, Agent, or Firm* — Schwegman Lundberg & Woessner, P.A.

(57) ABSTRACT

The present invention pertains to a submount for mechanically and electrically coupling an electronic component to a carrier. The submount has a mounting portion for mounting the submount to the carrier and has attachment portions for holding the electronic component. The submount further has primary electric contacts for cooperation with respective electrical conductors in the carrier, and secondary electric contacts for cooperation with respective electric contacts of the electronic component. The secondary electric contacts are electrically connected to primary electric contacts. The attachment portions are coupled to the mounting portion by respective extension portions that are laterally stretchable in a plane defined by the mounting portion to allow a displacement of the attachment portions in a direction away from the mounting portion.

14 Claims, 11 Drawing Sheets

(51) Int. Cl.
*H05K 1/02* (2006.01)
*H05K 1/09* (2006.01)
*H05K 13/00* (2006.01)
*H05K 1/03* (2006.01)
*H05K 1/18* (2006.01)
*H05K 3/30* (2006.01)

(52) U.S. Cl.
CPC .......... *H05K 13/0023* (2013.01); *H05K 1/038* (2013.01); *H05K 1/189* (2013.01); *H05K 3/301* (2013.01); *H05K 2201/09263* (2013.01); *H05K 2201/09418* (2013.01); *H05K 2201/10106* (2013.01); *H05K 2201/10962* (2013.01); *Y10T 29/49002* (2015.01)

(56) References Cited

U.S. PATENT DOCUMENTS

| | | | |
|---|---|---|---|
| 2004/0192082 A1* | 9/2004 | Wagner | H05K 1/0283 439/67 |
| 2007/0122590 A1* | 5/2007 | Lalvani | B32B 3/266 428/136 |
| 2009/0317639 A1* | 12/2009 | Axisa | B32B 37/185 428/411.1 |
| 2010/0002402 A1* | 1/2010 | Rogers | H01L 21/4867 361/749 |
| 2010/0330338 A1 | 12/2010 | Boyce et al. | |
| 2012/0051005 A1* | 3/2012 | Vanfleteren | H01L 21/565 361/749 |

FOREIGN PATENT DOCUMENTS

| | | |
|---|---|---|
| WO | WO-2008007237 A2 | 1/2008 |
| WO | WO-2008084412 A1 | 7/2008 |
| WO | WO-2009150570 A1 | 12/2009 |
| WO | WO-2010058360 A1 | 5/2010 |
| WO | WO-2010067273 A1 | 6/2010 |
| WO | WO-2010086416 A1 | 8/2010 |
| WO | WO-2011093713 A2 | 8/2011 |
| WO | WO-2013137732 A1 | 9/2013 |

OTHER PUBLICATIONS

"International Application Serial No. PCT/NL2013/050172, International Search Report and Written Opinion mailed Jun. 5, 2013", 9 pgs.

Axisa, Fabrice, et al., "Lase based fast prototyping methodology of producing stretchable and conformable electronic systems", Electronic Systemsintegration Technology Conference, (2008), 1387-1390.

Kim, Hyun-Joong, et al., "A multiaxial stretchable interconnect using liquid-alloy-filled elastomeric microchannels", Applied Physics Letters 92(1), (2008), 11904:1-3.

* cited by examiner

SUBMOUNT, ASSEMBLY INCLUDING SUBMOUNT, METHOD OF ASSEMBLING AND ASSEMBLING DEVICE

PRIORITY APPLICATIONS

This application is a U.S. National Stage Filing under 35 U.S.C. 0371 from International Application No. PCT/NL2013/050172, filed on 14 Mar. 2013, and published as WO/2013/137732 on 19 Sep. 2013, which application claims the benefit of priority under 35 U.S.C. 0119 to EP Application No. 12159639.9, filed on 15 Mar. 2012; which applications and publications are incorporated herein by reference in their entirety.

BACKGROUND OF THE INVENTION

1. Field of the Invention

The present invention relates to a submount for arranging electronic elements on a substrate, and to an arrangement comprising such a submount arranged on a substrate. The present invention further relates to a method and a device for assembling at least one such submount and an electronic element.

2. Related Art

Many types of textiles are used in every day life. Simultaneously, the use of electronic equipment in daily life, such as display devices, mobile phones, media players, navigation equipment, and different kinds of sensors increases dramatically. When electronic equipment is integrated into textiles, new application fields appear, such as textile based display devices, clothes that can tell the present location and point out the direction to a desired location etc.

For ultimate textile integration of electronic elements, the interconnecting substrate, e.g. the driving circuitry, should be entirely made of fabrics.

However, direct attachment of distributed electronic components, such as LEDs, onto a textile substrate for example by using conductive epoxy is a very delicate and time-consuming process. Direct soldering of the components onto the textile substrate may often be problematic as well, for example due to the low melting temperature of several textile fibers, such as polyester.

Thus, there is a need in the art for means and methods for arranging electrical components on textile substrates that can be used independent on the nature of the textile fiber, which are well suited for automated arrangement, and which provides a robust attachment of the electronic components on the textile substrate.

WO 2010/086416 A1 (WO '416) discloses a stretchable electronic device comprising a stretchable interconnection electrically connecting two electronic components. The stretchable interconnection comprises an electrically conductive channel and a first flexible supporting layer provided for supporting the electrically conductive channel. The supporting layer has a predetermined second geometry that restricts stretchability of the electrically conductive channel below its elastic limit. (See Abstract)

WO '416 mentions on page 15, lines 20-22 the possible use of a submount (interposer), i.e. an intermediate component between the substrate and an electric component as follows: "These support parts create flexible circuit islands on which several electronic components or interposers 69, 79, 89 can be mounted." WO '416 however discloses no details about the construction of a submount.

It is noted that DE 10 2007 014 477 (DE'477) discloses a method for fastening electrically conductive thread to textile fabric. Therein electrically conductive thread is used as reel thread and fastening is carried out in form of two-thread lock stitch seam. The electrically conductive thread may be used as needle thread, or may be inlaid in a zigzag seam as a third thread system. (Abstract) In an embodiment, as described in paragraph 50 with reference to FIG. 11, a Velcro-tape (Klettkontaktierung/klittenband contact) is used to mount a LED on the fabric.

A known construction of a submount for integrating electrical components into textiles is described in WO 2008007237 (A2). The submount disclosed therein comprises a head member and at least one substrate-engaging member protruding from the head member. The head member comprises at least two, from each other isolated, electrically conductive portions, where each electrically conductive portion comprises a component contact, adapted for connection of electronic components thereto, and a substrate contact arranged on said substrate side, adapted for bringing said electrically conductive portions in contact with a circuitry comprised in said substrate. The submount of the present invention may be used to attach electronic components, such as light-emitting diodes, to a textile substrate, without the need for soldering the electronic component directly on the substrate.

In an embodiment, the head member of the submount represents a male member of a snap fastener. This submount is especially adapted for being connected to an electronic component having the shape of representing a female member of a snap fastener. The head member comprises an engaging protrusion for engaging with a recess in the electronic component.

The first component contact of the head member is arranged on the base surface of the head member. The second component contact of the head member is arranged at the top of the protrusion. For connection to this, the electronic component has a first connector arranged on the base surface, and a second connector arranged in the engaging recess. Thus, when the electronic component is snap-locked on the submount, the first component contact, arranged on the base surface of the head member is contacted to the first connector, arranged on the base surface of the electronic device. Further, the second component contact, arranged on the engaging protrusion, is contacted with the second connector arranged in the engaging recess of the electronic component.

In the known arrangement it is required that the electronic component has a relatively high mechanical strength, so that it is not damaged when it is snapped onto the submount.

An improved type of submount is desired that is also suitable for mounting more fragile electronic components.

SUMMARY OF THE INVENTION

It is a first object of the invention to provide an improved type of submount that is also suitable for mounting more fragile electronic components.

It is a second object of the invention to provide an assembly of a carrier and at least one such submount.

It is a third object of the invention to provide an assembly of a carrier and at least one such submount holding an electronic component.

It is a fourth object of the invention to provide a method of assembling at least one such submount and an electronic component.

It is fifth object of the invention to provide an assembling device for assembling at least one such submount and an electronic component.

According to a first aspect of the invention a submount is provided for mechanically and electrically coupling an electronic component to a carrier, the submount having a mounting portion for mounting the submount to the carrier, having attachment portions for holding the electronic component, and having primary electric contacts for cooperation with respective electrical conductors in the carrier, and secondary electric contacts for cooperation with respective electric contacts of the electronic component, the secondary electric contacts being electrically connected to primary electric contacts, wherein the attachment portions are coupled to the mounting portion by respective extension portions that are laterally stretchable in a plane defined by the mounting portion to allow a displacement of the attachment portions in a direction away from the mounting portion. An electronic component can be assembled with the submount according to the first aspect of the invention without exerting a substantial force perpendicular to a main surface of the electronic component. This also makes the submount suitable for assembly with relatively fragile electronic components. It is an additional advantage of the submount according to the present invention that the contact area of the submount with the carrier can be relatively small as compared to the area occupied by the electronic component. In this way an unobtrusive mounting of the electronic components onto the carrier, for example textile substrates is provided that enables the carrier to remain its soft and pliable character, even if the electronic components are substantially more rigid than the carrier.

According to a second aspect of the invention an assembly of a carrier and at least one such submount is provided.

According to a third aspect of the invention an assembly of a carrier and at least one such submount holding an electronic component is provided.

According to a fourth aspect of the invention a method of assembling at least one such submount and an electronic component is provided.

According to a fifth aspect of the invention an assembling device for assembling at least one such submount and an electronic component is provided.

BRIEF DESCRIPTION OF THE DRAWINGS

These and other aspects are described in more detail with reference to the drawing. Therein:

FIG. 6A, 6B show a method of assembling a further embodiment of a submount with an appropriate electronic component, therein

DETAILED DESCRIPTION OF EMBODIMENTS

Like reference symbols in the various drawings indicate like elements unless otherwise indicated.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various items these items should not be limited by these terms. Items are understood to mean features described such components or elements or aspects of components or elements, e.g. a surface of an element or a height of an element. These terms are only used to distinguish one item from another item. Thus, a first item could be termed a second item without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 1A:
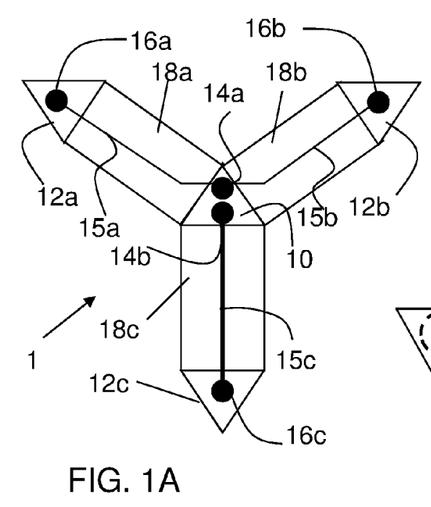
FIG. 1A schematically shows a first embodiment of a submount according to the present invention, FIG. 1B schematically shows an electronic component suitable to be attached to the submount of FIG. 1A.
Figure 1B:
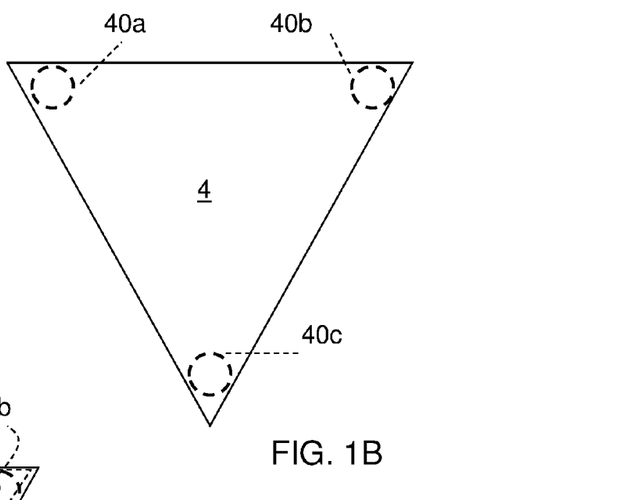
Figure 1C:
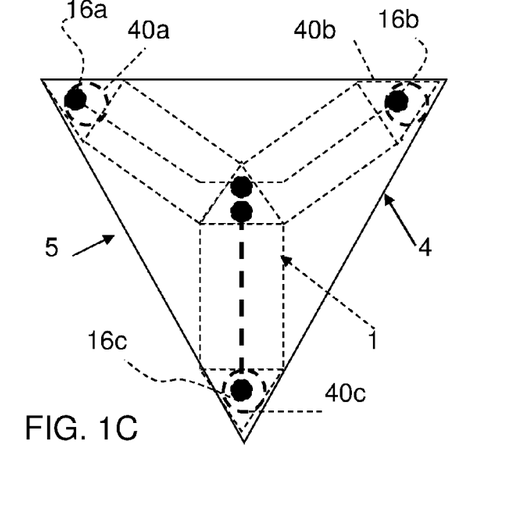
FIG. 1C shows an subassembly of the submount of FIG. 1A and the electronic component of FIG. 1B.

FIGS. 1A, 1B and 1C respectively show a submount 1, an electronic component 4, and an assembly 5 of an electronic component 4 coupled with the submount 1.

Figure 2:
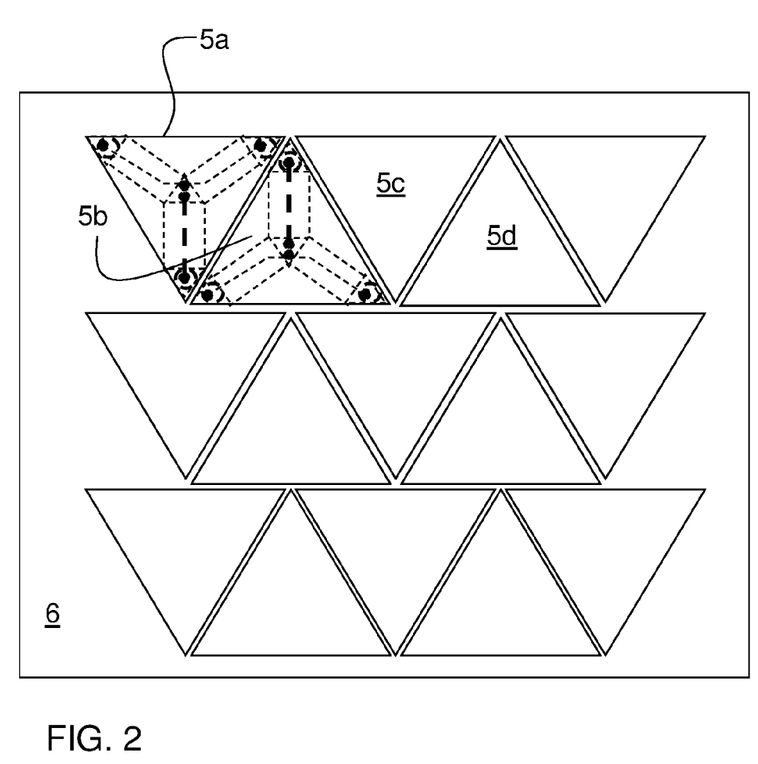
FIG. 2 shows an assembly of a carrier with a plurality of subassemblies shown in FIG. 1C.

The submount 1 serves for mechanically and electrically coupling an electronic component 4 to a carrier 6 (See FIG. 2). The submount 1 has a mounting portion 10 for mounting the submount to the carrier and has attachment portions 12a, 12b, 12c for holding the electronic component 4. The submount 1 further has primary electric contacts 14a, 14b for cooperation with respective electrical conductors in the carrier, and secondary electric contacts 16a, 16b, 16c for cooperation with respective electric contacts 40a, 40b, 40c of the electronic component 4. The secondary electric contacts 16a, 16b, 16c are each electrically connected to a primary electric contact 14a, 14b. In this case secondary electric contacts 16a, 16b are both connected with primary electric contact 14a via electrical connections 15a, 15b and secondary electric contact 16c is electrically connected to primary electric contact 14b via connection 15c. The attachment portions 12a, 12b, 12c are coupled to the mounting portion 10 by respective extension portions 18a, 18b, 18c, that are laterally stretchable in a plane defined by the mounting portion 20 (herein coinciding with the plane of the drawing) to allow a displacement of the attachment portions 12a, 12b, 12c in a direction away from the mounting portion 20. The electrical connections 15a, 15b, 15c are schematically shown as lines. However, the electrical connections may have any shape. Preferably the electrical connections extend over the full width of the extension portions to provide for low impedance connection between the second and the primary electrical contact. Nevertheless, for some types of electrical components it may be desired that an extension portion has more than one electrical connection. In some cases it may be favorable that the electrical connection has a relatively small width, so that it can serve as a resistor.

FIG. 1B schematically shows an electronic component 4, for example a photovoltaic cell or a light-emitting component. The electronic component has respective electric device contacts 40a, 40b, 40c on a rear side to be attached to the submount. FIG. 1C shows the assembly 5 of an electronic component 4 coupled with the submount 1. Therein the secondary electric contacts 16a, 16b, 16c of the submount are electrically connected with respective electric device contacts 40a, 40b, 40c of the electronic component 4. The electric connection between the secondary electric contacts 16a, 16b, 16c of the submount 1 and the device contacts 40a, 40b, 40c of the electronic component 4 is for example realized by an electrically conductive adhesive. The electrically conductive adhesive may further also provide for a mechanical coupling between the submount 1 and the electronic component 4.

FIG. 2 shows an assembly of a carrier 6 with a plurality of assemblies 5a, 5b, 5c, 5d . . . etc, each comprising a submount 1 holding an electronic component 4. In order not to obscure the drawing only the assemblies 5a, 5b are shown in detail.

Figure 3A:
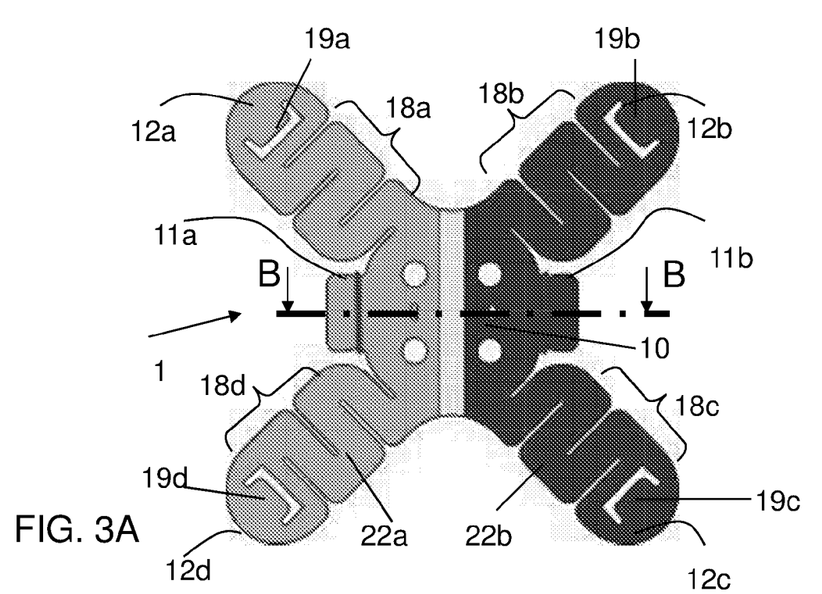
FIG. 3A shows a second embodiment of a submount according to the present invention attached to a carrier.
Figure 3B:
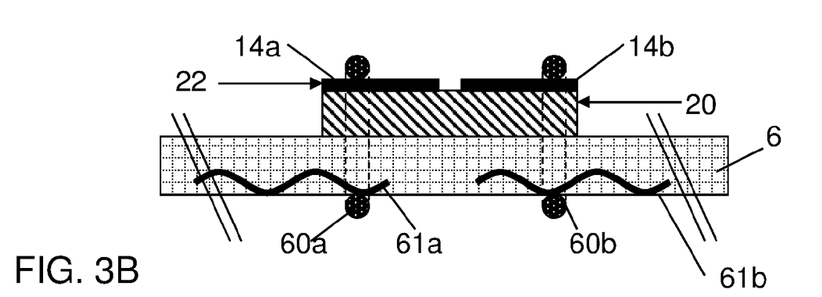
FIG. 3B shows a cross-section according to B-B in FIG. 3A.

FIG. 3A shows a presently preferred embodiment of a submount 1. FIG. 3B shows a cross-section according to B-B in FIG. 3A. The submount 1 according to this presently preferred embodiment is integrally formed of a polymer foil 20 coated with a metal layer 22. By way of example the polymer foil 20 is a PEN-foil having a thickness of 125 μm and the metal layer 22 is a copper layer having a thickness of 15 μm. However, it will be immediately apparent that also other materials and/or other thicknesses may be used depending on the required strength and flexibility of the submount. As shown in FIG. 3B, the metal layer 22 is locally interrupted to provide for a first electrically conductive zone with a first primary electric contact 14a, and a second electrically conductive zone with a second primary electric contact 14b. In the embodiment shown, the extension portions of the submount have a meandering shape. In this case it is not necessary that the extension portions are made of stretchable material. It is sufficient that the material of the extension portions is flexible. Most polymer foils, e.g. PET, PEN etc comply with this requirement. This has the advantage that the mechanical properties of the different portions of the submount are well defined by their shape. Therewith, even while the submount is integrally formed from a particular type of foil, the mounting portion and the attachment portion can be relatively rigid, whereas the extension portions can be stretchable.

In the embodiment shown the submount 1 is shaped with laser cutting, punched or cut in such a way that free standing meanders 18a, . . . , 18d are formed which can be elongated. These meanders act as a spring once elongated. This spring when realized e.g. four fold at the edges of the foil can retain an electronic component in the middle of the interposer when clamped in as described in more detail in FIG. 5B to 5E. By matching the area of the electronic component to the dimensions of the interposer, the stress in the spring can be set.

As shown in FIG. 3B, in this example the submount 1 is mounted at lips 11a, 11b to the carrier 6, by a pair of electrically conductive wires 60a, 60b. The wires 60a, 60b therewith provide for a mechanical coupling of the submount 1 to the carrier 6. Additionally the wires 60a, 60b each provide for an electrical connection of a respective conductive zone 14a, 14b of the submount 1 with a respective electrical conductor 61a, 61b of the carrier 6.

Figure 4A:
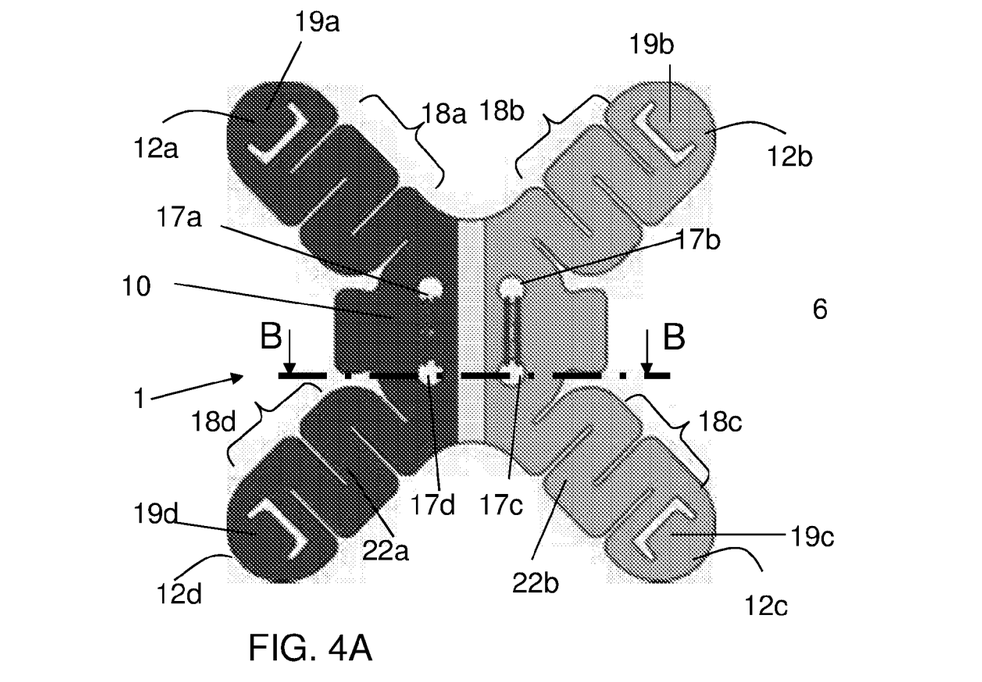
FIG. 4A shows a second embodiment of a submount according to the present invention attached to a carrier in an alternative way.
Figure 4B:
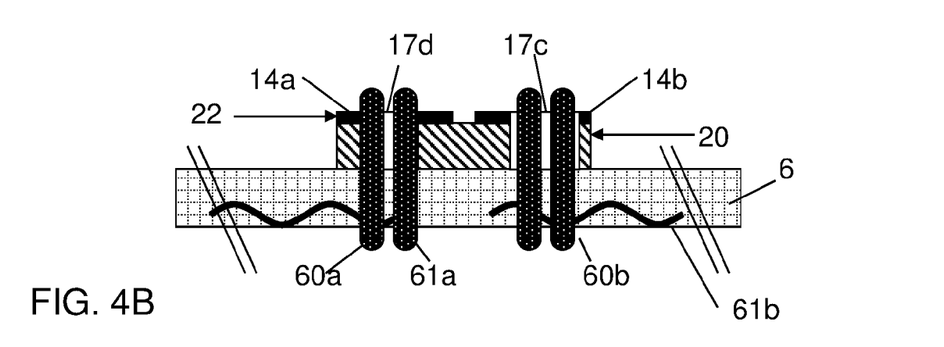
FIG. 4B shows a cross-section according to B-B in FIG. 4A, FIG. 5A schematically shows an electronic component suitable to be attached to the submount of FIG. 4A.

FIG. 4A, 4B illustrate a variant of the embodiment of FIG. 3A, 3B. FIG. 4B shows a cross-section according to B-B in FIG. 4A. The cross-section in FIG. 4B is shown magnified for clarity. In the embodiment of FIG. 4A, 4B the submount 1 is sewed to the carrier by electrically conductive wires 60a, 60b, through openings 17a, 17b, 17c, 17d in its mounting portion 10.

Other ways of mounting and electrically connecting a component to a carrier, such as a textile, may be found in WO 2008007237 cited above, and in WO2011093713.

In the embodiments of the submount 1, shown in FIGS. 3A, 3B, 4A and 4B, wherein the attachment portions 12a, 12b, 12c, 12d comprise a respective gripping component 19a, 19b, 19c, 19d in the form of an inwardly pointing hook.

Figure 5A:
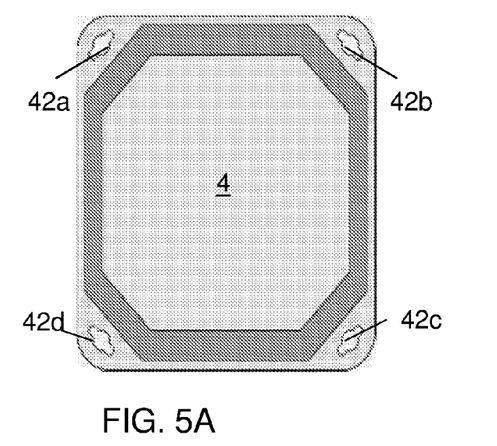
Figure 5B:
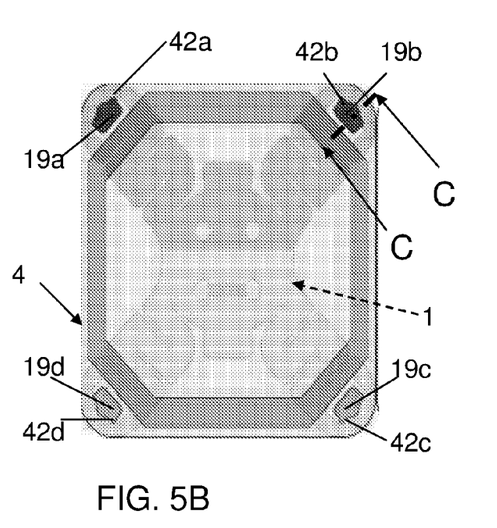
FIG. 5B shows an assembly of the submount of FIG. 4A and the component of FIG. 5A.

FIG. 5A shows an electronic component 4 suitable to be assembled with the submount 1. The electronic component 4, e.g. an OLED or a photovoltaic cell has openings 42a, 42b, 42c, 42d to cooperate with the gripping elements 19a, 19b, 19c, 19d of the submount 1 as shown in FIG. 3A, 3B, 4A, 4B for example. The assembly obtained therewith is schematically illustrated in FIG. 5B. In the assembly the hooks 19a, 19b, 19c, 19d extend through the openings 42a, 42b, 42c, 42d of the electronic component 4. The extension portions 18a, . . . d exert a radially inward pulling force to the hooks 19a, . . . d to maintain a good grip on the electronic component 4. The connection so obtained is also shown schematically in FIG. 5C, which is a cross-section according to C-C in FIG. 5B.

The electronic component 4 may be mounted to the surmount 1 by first pulling the extension portions 18a, . . . , d outward, applying the electronic component 4 to the submount 1 and allowing the extension portions 18a, . . . , d to relax so that the hooks 19a, . . . , d pierce through the openings 42a, . . . , d of the electronic component. In an embodiment the electronic component 4 is placed on the submount 1 allowing one of the hooks, e.g. 19b to pierce through the corresponding opening 42b. Then a force is exerted on the electronic component 4 in the plane of the submount 1 to position another opening of the electronic component 4 in front of a respective hook to cause said hook to enter the respective opening of the electronic component 4. This can be repeated until the electronic component 4 is fully coupled to the submount. In case the electronic component 4 is fragile damage during these positioning operations may be prevented by positioning the electronic component with a suction gripper having a substantially homogeneous suction force over the surface of the electronic component 4.

An electric connection between the submount 1 and the electronic component 4 may be formed by electric contacts at a side of said component facing the submount 1 at the location of the attachment portions 12a, . . . , 12d of the submount. The clamping force exerted by the extension portions 18a, . . . , 18d therewith forces the electric contacts of the component against the electric contacts formed by the attachment portions 12a, . . . , 12d of the submount.

The mechanical connections formed by the cooperation between the gripping elements 19a, . . . , 19d of the submount and the openings 42a, . . . , 42d may be reinforced by application of an adhesive. Preferably an electrically conductive adhesive is used as this also reinforces the electric connections between the component 4 and the submount 1.

Figure 5C:
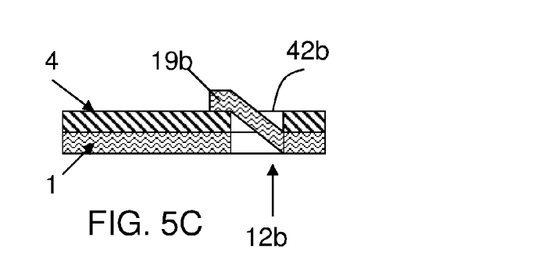
FIG. 5C shows a detail a connection between the submount and the component according to C-C in FIG. 5B.
Figure 5D:
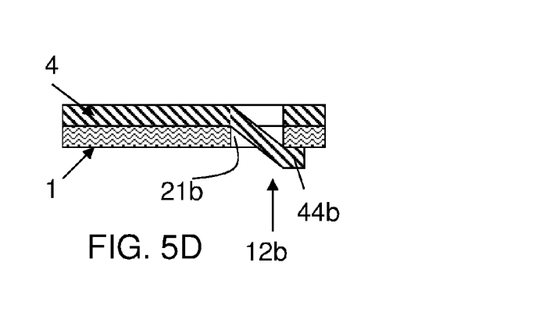
FIG. 5D shows a first alternative for said connection.

FIG. 5D shows an alternative embodiment, in a cross-section similar to that of FIG. 5C, wherein the electronic component has radially outward point hooks e.g. 44b that cooperate with openings e.g. 21b in the attachment portion of the submount 1. In this case the openings 21b form a gripping element.

FIG. 5E shows again an alternative embodiment, in a cross-section similar to that of FIG. 5C, wherein the attachment portion of the submount 1 has protrusions e.g. 23b that snap into openings e.g. 42b of the electronic component 4.

Figure 6A:
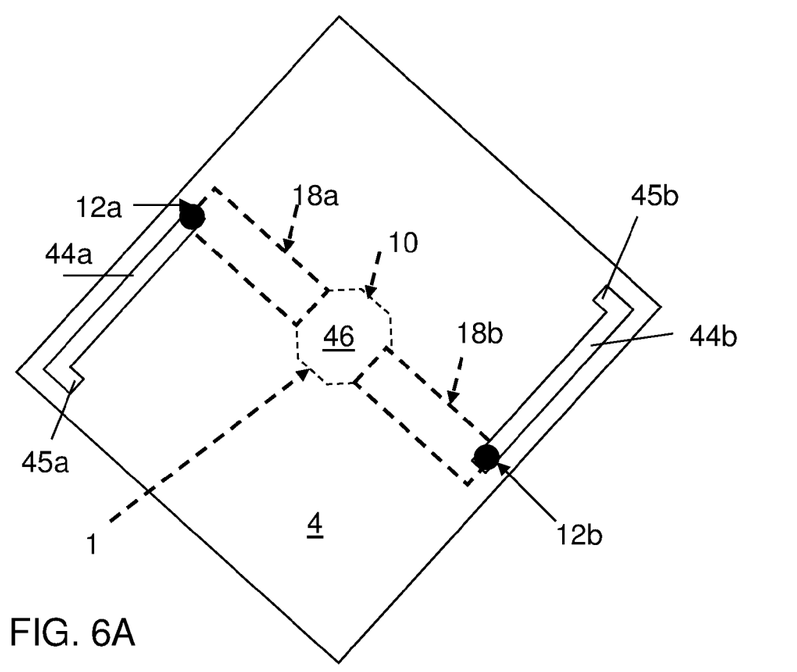
FIG. 6A shows a first assembly stage and FIG. 6B shows a second assembly stage.
Figure 6B:
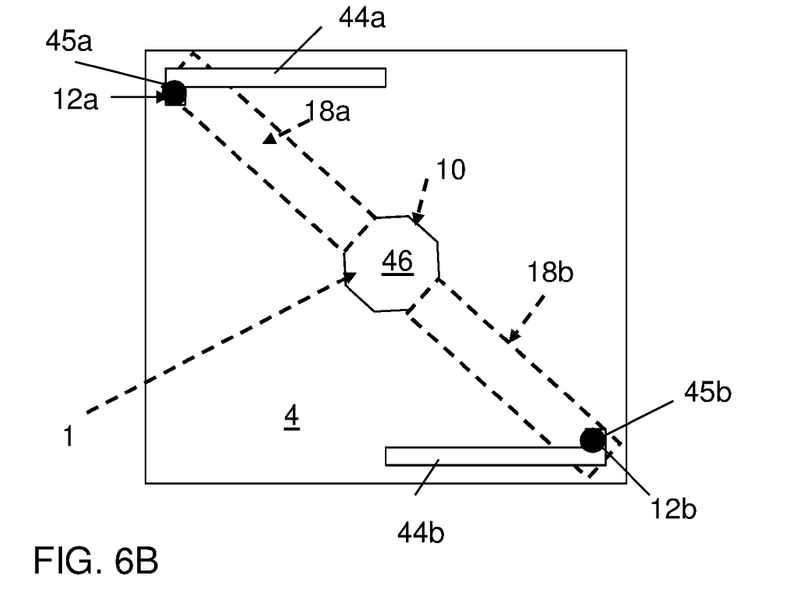

FIGS. 6A and 6B illustrate another embodiment of the submount 1 and its assembly with an electronic component 4. Parts of the submount 1 hidden behind the electronic component 4 are shown by dashed lines. In this embodiment the electronic component has slits 44a, 44b having a respective end portion 45a, 45b. In a direction towards their end portions 45a, 45b the slits 44a, 44b extend away over a first distance from a center 46 of the electronic component 4 and the slits 44a, 44b extend again towards the center in their end portions 45a, 45b over a second distance, smaller than the first distance.

FIG. 6A shows how the electronic component 4 is initially placed on the submount 1, with the attachment portion 12a arranged before an end of a slit 44a, opposite the end portion 45a of the slit. Similarly the attachment portion 12b is arranged before an end of a slit 44b, opposite the end portion 45b of the slit 44b. Therewith a protrusion, e.g. a hook of the attachment portions 12a, 12b extends through the slits 44a, 44b.

Subsequently the electronic component 4 is rotated clockwise over 45 degrees, while holding the protrusions formed at the attachment portions 12a, 12b. Therewith the extension portions 18a, 18b are stretched and relax slightly when the protrusions of the extension portions snap into the end portions 45a, 45b of the slits 44a, 44b as shown in FIG. 6B.

Figure 7A:
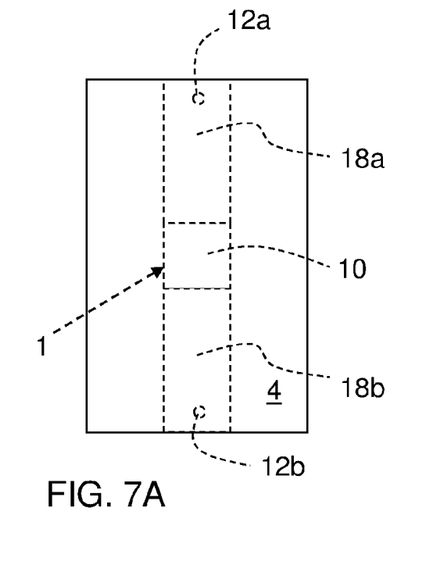
FIG. 7A shows a third embodiment of a submount, here assembled with an electronic component.
Figure 7B:
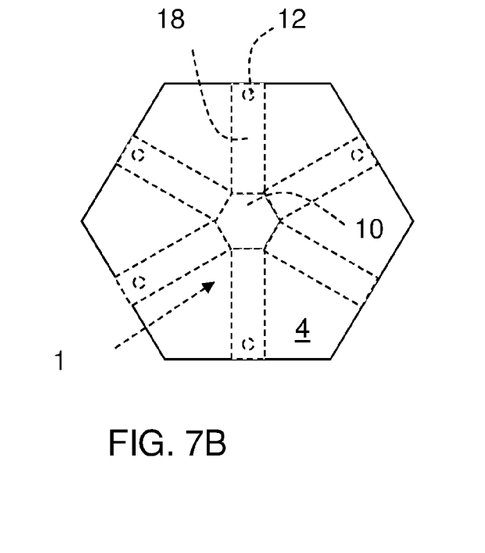
FIG. 7B shows a fourth embodiment of a submount, here assembled with an electronic component, FIG. 8 schematically shows a manufacturing arrangement and a manufacturing process.

FIGS. 7A and 7B show other examples of a submount 1 assembled with an electronic component 4. In the embodiment of FIG. 7A the submount 1 has only extension portions 18a, 18b with a respective attachment portion 12a, 12b. In the embodiment of FIG. 7B the submount 1 has six extension portions 18 with a respective attachment portion 12.

In an embodiment the submount may be asymmetric with respect to rotations in the plane defined by the mounting portion. In this way the orientation in the plane can be rapidly determined. This is particular advantageous for mounting of components that are critical in the way they are electrically connected to the carrier.

Figure 8:
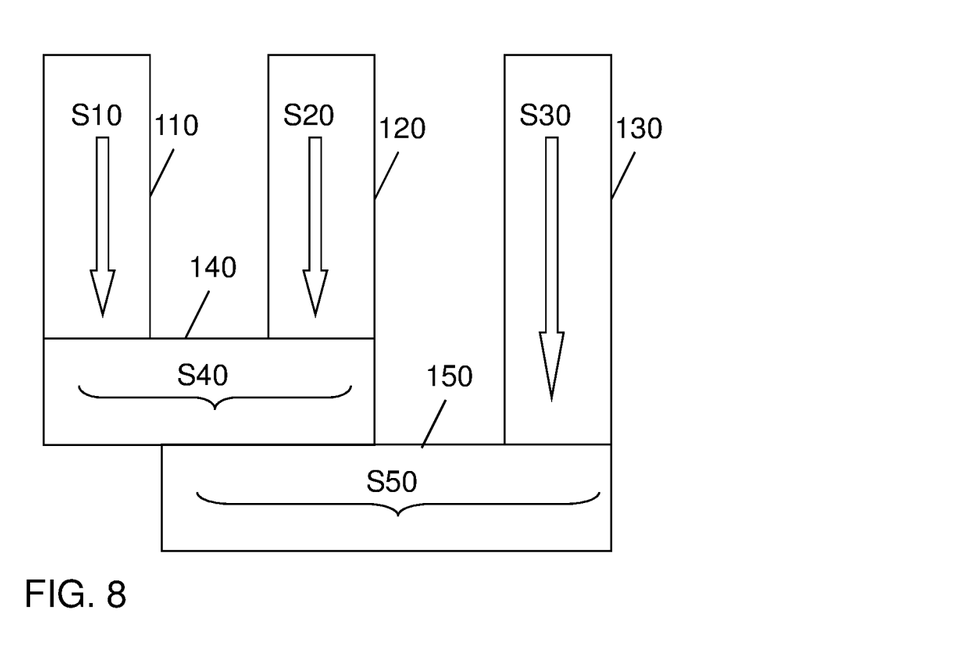

FIG. 8 schematically shows a manufacturing arrangement for manufacturing a carrier 6 comprising electronic components 4 attached thereto with a respective submount 1, e.g. as shown in FIG. 2. The manufacturing arrangement comprises a first manufacturing line 110 for manufacturing the carrier 6, a second manufacturing line 120 for manufacturing submounts 1, and a manufacturing line 130 for manufacturing electronic components 4. The manufacturing arrangement further comprises a first assembly station 140 for assembling submounts 1 with the carrier 6 and a second assembly station 150 for assembling the electronic components 4 with a respective submount 1.

During operation the manufacturing arrangement carries out a manufacturing process for manufacturing a carrier 6 comprising electronic components 4 attached thereto with a respective submount 1. The manufacturing steps comprise first process steps S10 for manufacturing the carrier 6, second process steps S20 for manufacturing the submount 1 and third processing steps S30 for manufacturing the electronic component 4. The manufacturing process further comprises first assembly steps S40 for assembling submounts 1 with the carrier 6 and second assembly steps S50 for assembling electronic components with respective submounts 1.

The carrier 6 may be manufactured by a process known as such, e.g. a known process S10 for manufacturing a textile having electrical conductors. The electronic components 4 may be manufactured by a process S30 known as such, e.g. a process for manufacturing (O)LEDs, photovoltaic elements or batteries.

Figure 9:
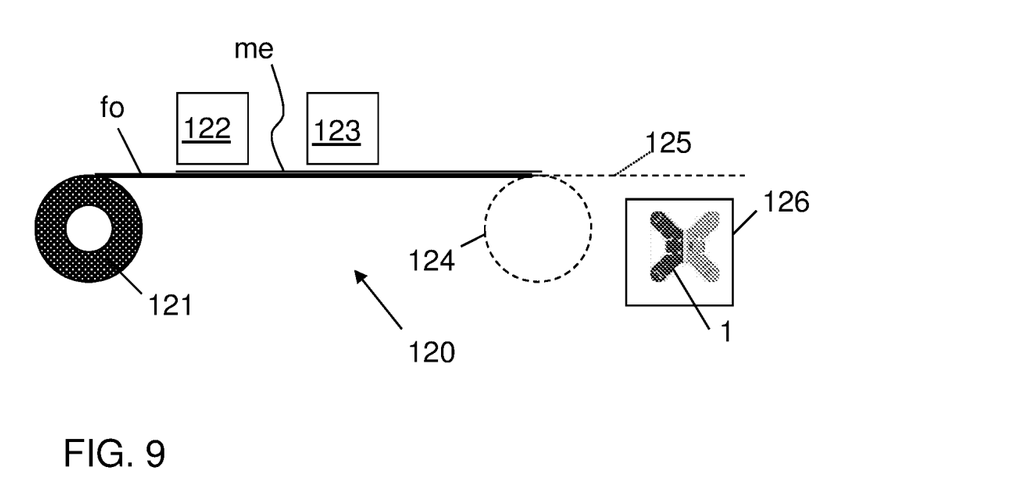
FIG. 9 shows a first part of the manufacturing arrangement in more detail.

FIG. 9 schematically shows an embodiment of a manufacturing line 120 according to the present invention for manufacturing submounts 1.

The embodiment of the manufacturing line 120 shown comprises a supply roll 121 for supplying a polymer foil fo, e.g. a PEN or PET foil. The manufacturing line 120 further comprises a deposition station 122 for depositing a metal layer me upon the foil. Additionally the manufacturing line 120 comprises a patterning station 123 for patterning the foil into a shape desired for the submount, e.g. as shown in FIG. 1A, 3A, 6A, 7A or 7B. The patterning station 123 may also pattern the deposited metal layer me into mutually insulated zones, e.g. zones 22a, 22b (FIG. 4A). Alternatively the deposition station 122 may already have deposited the metal layer me according to the desired pattern. The manufacturing line 120 may further have a separation station (not shown) for separating submounts 1 from the foil fo. Alternatively the patterning station 123 may separate submounts 1. In an embodiment the submounts 1 are not separated from the foil fo in this manufacturing line, but the foil is weakened at a contour of the submounts 1 to be formed, for example by partially cutting the foil fo, e.g. by removing the foil until a fraction of its depth or by perforating the foil along said contour according to a dot-pattern. In that case the submounts 1 can be removed from the foil fo in a later stage of the manufacturing process. In that case the foil fo may be rewinded onto a storage roll 124 or transported for further handling with transport means 125. The finished submounts 1 may be stored in a storage box 126 or transported by transport means 125. Patterning of the foil fo may be realized with mechanical cutting tools. Preferably however the foil is patterned by a laser patterning station. In that case there is no physical contact between the patterning station and the foil fo and/or the metal layer me. This renders it possible to continuously transport the foil.

Assembly station 140 assembles the submounts 1 with the carrier 6 in a way known as such, for example in a way analogous as indicated in WO2011093713.

Figure 5E:
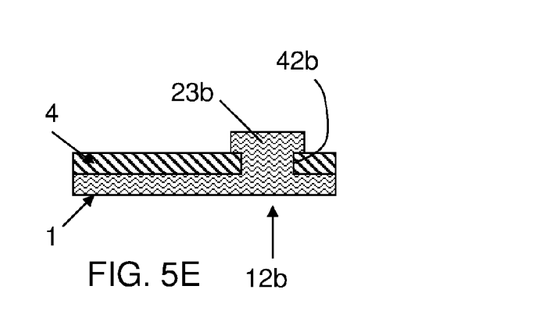
FIG. 5E shows a second alternative for said connection.
Figure 10:
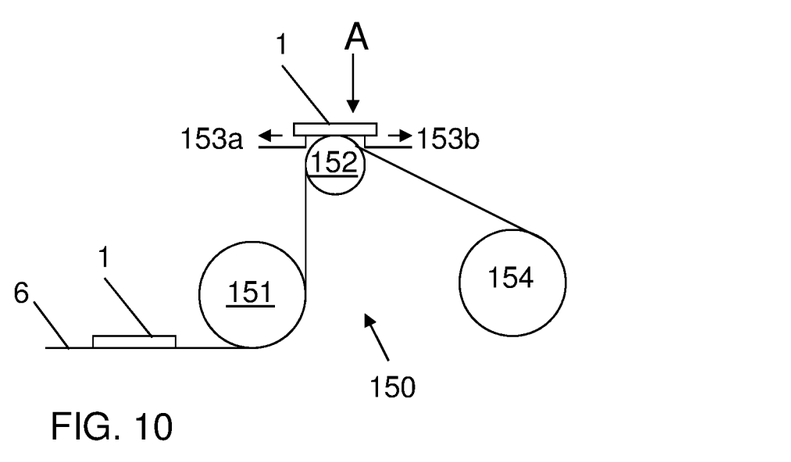
FIG. 10 shows a second part of the manufacturing arrangement in more detail, in a first stage of the manufacturing process.
Figure 10A:
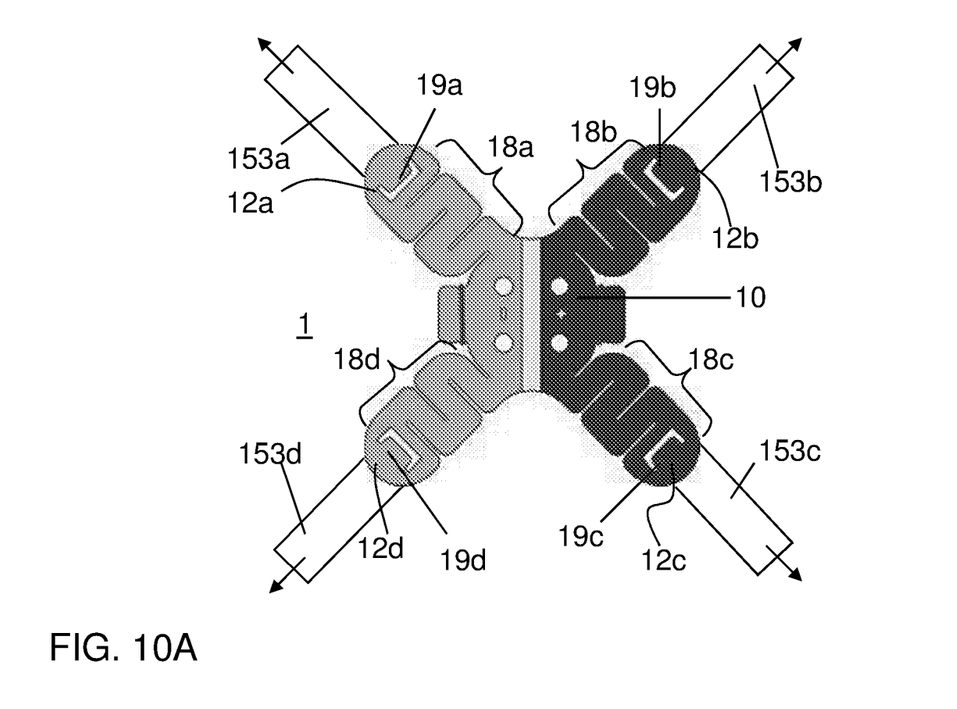
FIG. 10A shows a detail of this manufacturing arrangement.
Figure 10B:
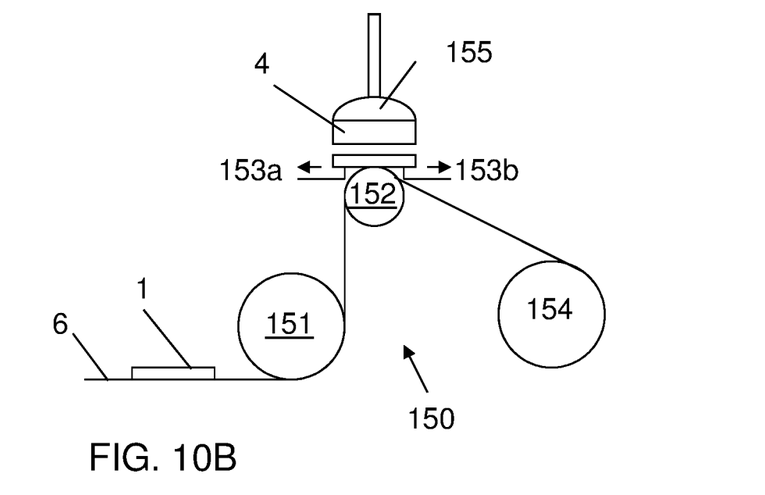
FIG. 10B shows the second part of the manufacturing arrangement of FIG. 10 in a second stage of the manufacturing process.
Figure 10C:
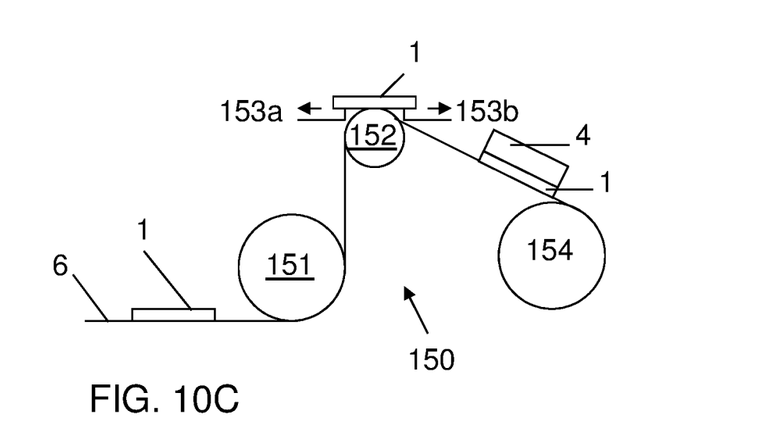
FIG. 10C shows the second part of the manufacturing arrangement of FIG. 10 in a third stage of the manufacturing process.

FIG. 10 schematically shows an embodiment of an assembly station 150 for assembling electronic components 4 with their submounts 1. FIG. 10A shows a detail according to view A in FIG. 10. In the assembly station of FIG. 10, a carrier 6 with submounts 1 is provided, of which only two are shown here for clarity. The carrier 6 is transported over a guidance roll 151 to a carrier curving roll 152 for convexly curving the carrier 6 at a side carrying the submounts 1. As the submounts 1 are only mounted in their mounting portion 10 to the carrier 6, the extension portions 18a, ..., 18d ending into the attachment portions 12a, ..., 12d resiliently move away from the surface of the carrier 6. In this state of the submount, stretch tools 153a, 153b, 153c, 153d grip into a respective attachment portion 12a, 12b, 12c, 12d and stretch the corresponding extension portion 18a, 18b, 18c, 18d in a lateral direction away from the mounting portion 10 as indicated by the arrows in FIG. 10A. Therewith the stretch tools 153a, 153b, 153c, 153d may push the hook 19a, ..., 19d upwards, i.e. in a direction away from the carrier 6. As shown in FIG. 10B, in this extended state of the extension portions 18a, ..., 18d a placement device 155 places the electronic component 4 onto the submount 1, so that the attachment portions of the submount 1 grip into the corresponding attachment portions of the electronic component 4 to be mounted, e.g. as shown in FIGS. 5C, 5D and 5E. Subsequently the stretch tools 153a, ..., d release the submount therewith causing the electronic component 4 to remain fixed to the submount 1, See FIG. 10C. Subsequently the carrier 6 with the submount 1 is transported to storage roll 154.

Figure 11:
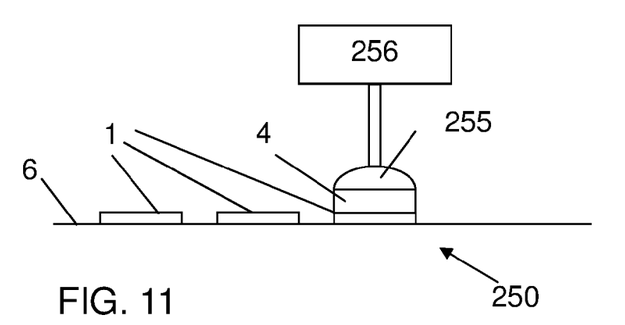
FIG. 11 shows an alternative embodiment of the second part of the manufacturing arrangement.

FIG. 11 shows an alternative arrangement 250 of the assembly station for assembling the electronic components 4 with their submounts 1. In this embodiment the assembly station 250 has a placement tool 255 that is capable of laterally displacing the electronic component 4 after it is initially placed onto the submount 1.

Figure 11A:
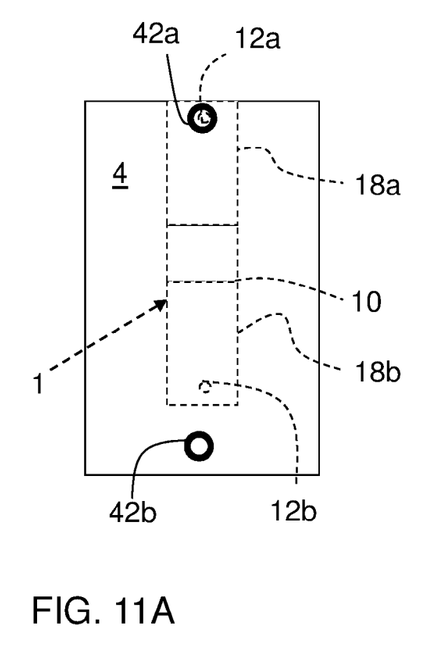
FIG. 11A shows a submount and an electronic component to be assembled by said alternative embodiment in a first stage of the manufacturing process.

FIG. 11A shows the component 4 that is initially placed to allow one of the attachment portions 12a of the submount 1 to cooperate with a respective one of the attachment portions 42a of the electronic component 4, for example as shown in detail in FIG. 5C, 5D or 5E.

Figure 11B:
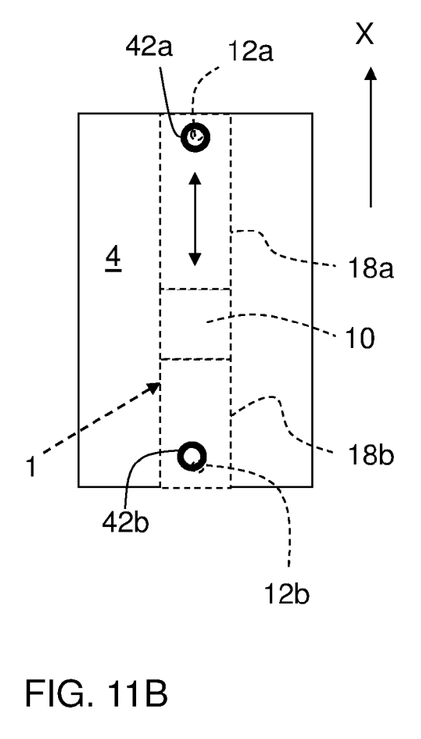
FIG. 11B shows the submount and the electronic component to be assembled by said alternative embodiment in a second stage of the manufacturing process.

FIG. 11B shows the effect of a lateral displacement of the electronic component 4 in the direction X caused by a displacement device 256 that displaces the placement tool 255. This causes the extension portion 18a having its attachment portion 12a coupled to the electronic component 4 to stretch in that direction, so that attachment portion 42b of the electronic component 4 is positioned against the corresponding attachment portion 12b of the submount, so that these attachment portions 12b, 42b can snap into each other.

The electronic component 4 can then be released by the placement tool 255. Although the principle is shown here for a submount 1 having two attachment portions coupled with an extension portion to the mounting portion, the method is equally applicable to more complicated submounts. For example for a submount 1 as shown in FIG. 7B the electronic component 4 can be connected to the submount using five lateral displacements after its initial placement wherein a connection is made between one of its attachment portions and a corresponding one of the submount.

It is not necessary that corresponding attachment portions e.g. 12a, 42b of the submount 1 and of the electronic component 4 intrinsically cooperate by a snapping action. Alternatively the mutually corresponding attachment portions may be surfaces that are adhered together. A rapidly curing adhesive may be used for this purpose, for example a UV-curable adhesive. In the embodiment of FIG. 10, this can be realized in that the stretching tool 153a, ..., 153d maintains the extension portions 18a, ..., 18d in their extended position, while the placement tool 155 maintains the electronic component 4 into position until the adhesive is cured.

In the embodiment of FIG. 11 this can be realized in that the lateral displacement caused by the placement tool 255 is postponed until the adhesive for adhering the attachment portions 12a, 42a is cured. Furthermore the placement tool 255 should keep component 4 fixed until the adhesive for adhering the attachment portions 12b, 42b is cured. In case the component 4 is to be attached with more than two attachment portions to respective attachment portions of the submount 1, the placement tool 255 should keep component 4 fixed each time until the adhesive for a respective corresponding set of attachment portions 12b, 42b is cured.

The present invention is in particular described for applications wherein the submount is used for electrically coupling an electronic component to a textile. Nevertheless the submount is equally applicable for coupling an electronic component to other types of carrier, e.g. rubber. In any case the submount enables mounting of a relatively rigid electronic component to a relatively more stretchable carrier.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A submount for mechanically and electrically coupling an electronic component to a carrier, the submount having a mounting portion for mounting the submount to the carrier, having attachment portions for holding the electronic component, and having primary electric contacts for cooperation with respective electrical conductors in the carrier, and secondary electric contacts for cooperation with respective electric contacts of the electronic component, the secondary electric contacts being electrically connected to primary electric contacts, wherein the attachment portions are coupled to the mounting portion by respective extension portions that are laterally stretchable in a plane defined by the mounting portion to allow a displacement of the attachment portions in a direction away from the mounting portion; wherein said respective attachment portions comprise a gripping element and wherein said electronic component is attached to said attachment portion by stretching at least one of said extension portions, arranging the electronic component upon said submount and allowing said at least one of said extension portions to at least partially relax to therewith have the attachment portions grip into respective attachment portions of said electronic component.

2. The submount of claim 1, wherein the submount is integrally formed of a polymer foil.

3. The submount of claim 1, wherein the extension portions have a meandering shape.

4. The submount of claim 1, wherein the attachment portion comprises a gripping element.

5. The submount of claim 1, further including an asymmetry for rotations in the plane of the mounting portion.

6. An assembly of a carrier and at least one submount according to claim 1.

7. An assembly of a carrier and at least one submount according to claim 1 holding an electronic component.

8. A method of assembling, comprising the step of
providing a carrier with at least one submount as claimed in claim 1,
providing an electronic component,
attaching the electronic component to attachment portions of said submount.

9. An assembling device for assembling an electronic component to a carrier with at least one submount has claimed in claim 1, the assembling device comprising
a facility for attaching the electronic component to the at least one submount,
a facility for maintaining at least one of the extension portions in a stretched state while attaching the component to the at least one submount.

10. The submount of claim 2, wherein the polymer foil is coated with a metal layer, the metal layer forming an electric connection between the secondary electric contacts and their primary electric contact.

11. The method of assembling of claim 8, wherein said electronic component is adhered to said attachment portions by an electrically conductive adhesive.

12. The method of assembling of claim 8, wherein the carrier is made of a flexible material, wherein the carrier is guided over a curved surface to provide a space between the carrier and the attachment portions of the submount, inserting a stretching tool within said space, stretching the extension portions with said stretching tool, placing the electronic component and releasing the extension portions to allow the attachment portions to snap into respective attachment portions of said electronic component.

13. The method of assembling of claim 8, comprising placing the electronic component in a position wherein at least one of its attachment portions cooperates with a respective attachment portion of the submount, exerting a force on the electronic component causing the extension portion corresponding to said attachment portion to stretch and therewith allowing at least a second one of the attachment portions of said electronic component to grip into another respective attachment portion of the submount.

14. The assembling device of claim 9, wherein the facility for maintaining the at least one of the extension portions in a stretched state is a displacement device for laterally displacing the facility for attaching.

* * * * *